United States Patent
Zhang

(10) Patent No.: US 8,084,783 B2
(45) Date of Patent: Dec. 27, 2011

(54) GAN-BASED DEVICE CASCODED WITH AN INTEGRATED FET/SCHOTTKY DIODE DEVICE

(75) Inventor: Ju Jason Zhang, Monterey Park, CA (US)

(73) Assignee: International Rectifier Corporation, El Segundo, CA (US)

(*) Notice: Subject to any disclaimer, the term of this patent is extended or adjusted under 35 U.S.C. 154(b) by 165 days.

(21) Appl. No.: 12/615,018

(22) Filed: Nov. 9, 2009

(65) Prior Publication Data
US 2010/0117095 A1 May 13, 2010

Related U.S. Application Data

(60) Provisional application No. 61/113,142, filed on Nov. 10, 2008.

(51) Int. Cl.
*H01L 29/66* (2006.01)
(52) U.S. Cl. ... 257/133; 257/79; 257/256; 257/E29.001; 257/109; 323/265; 323/235; 363/125
(58) Field of Classification Search ................. 257/289, 257/133; 323/265, 235; 363/125
See application file for complete search history.

(56) References Cited

U.S. PATENT DOCUMENTS

| | | | |
|---|---|---|---|
| 6,434,019 B2 * | 8/2002 | Baudelot et al. | ............... 363/16 |
| 7,180,762 B2 | 2/2007 | Soldano | |
| 2006/0081897 A1 * | 4/2006 | Yoshida | ...................... 257/289 |
| 2006/0175633 A1 | 8/2006 | Kinzer | |
| 2007/0215899 A1 | 9/2007 | Herman | |
| 2008/0180083 A1 | 7/2008 | Briere et al. | |

* cited by examiner

*Primary Examiner* — Marcos D. Pizarro
*Assistant Examiner* — Eva Yan Montalvo
(74) *Attorney, Agent, or Firm* — Greenberg Traurig LLP; Bradley B. Blanche

(57) ABSTRACT

A power semiconductor device is provided that includes a depletion mode (normally ON) main switching device cascoded with a higher speed switching device, resulting in an enhancement mode (normally OFF) FET device for switching power applications. The main switching device comprises a depletion mode GaN-based HEMT (High Electron Mobility Transistor) FET that does not include an intrinsic body diode. In one or more embodiments, the higher speed switching device comprises a high speed FET semiconductor switch arranged or connected in parallel with a Schottky diode. The high speed FET semiconductor switch may comprise a Si FET, GaN FET or any other type of FET which possesses higher speed switching capabilities and a lower voltage than that of the GaN-based HEMT FET. In some embodiments, the GaN-based HEMT FET and the higher speed switching device (i.e., the FET and Schottky diode) may be monolithically integrated on the same substrate.

20 Claims, 4 Drawing Sheets

Equivalent Circuit

High Voltage Schottky (prior art)

GAN-BASED DEVICE CASCODED WITH AN INTEGRATED FET/SCHOTTKY DIODE DEVICE

RELATED APPLICATION

This application claims the benefit of and priority to U.S. Provisional Application Ser. No. 61/113,142, filed Nov. 10, 2008, entitled, "GaN-Based Device Cascoded with an Integrated FET/Schottky Diode Device," the contents of which are incorporated by reference herein in its entirety.

TECHNICAL FIELD

The present invention relates generally to semiconductor devices and, more particularly, to gallium nitride (GaN)-based semiconductor devices.

BACKGROUND

GaN-based switching devices, such as hetero-junction field effect transistors (FETs), are well known to be advantageous over other types of conventional FET solutions in that they posses higher power densities, higher breakdown voltages and lower on-resistances. GaN FETs are typically formed as normally ON depletion mode devices. For certain applications, such as power applications, normally ON devices can be less desirable than normally OFF devices because normally ON devices are often operated less efficiently than normally OFF devices and the drive circuitry for normally ON devices has conventionally been more complicated and expensive than normally OFF devices. Thus, it is known to configure a depletion mode GaN FET 10 in a cascoded configuration with a Si FET 12, as shown in FIG. 1A, to make the device operate in a normally OFF enhanced mode. The circuit equivalent enhanced mode GaN FET 14 of FIG. 1A is illustrated in FIG. 1B. However, GaN FETs 10 do not possess an intrinsic body diode, and enhanced mode GaN FETs 14 must rely on the slow and inefficient internal body diodes of the Si FET 12.

SUMMARY

In one or more embodiments, a power semiconductor device is provided that includes a depletion mode (normally ON) main switching device cascoded with a higher speed switching device, the result of which is an enhancement mode (normally OFF) FET device for switching power applications. In one or more embodiments, the main switching device comprises a depletion mode GaN-based HEMT (High Electron Mobility Transistor) FET that does not include an intrinsic body diode. In one or more embodiments, the higher speed switching device comprises a high speed FET semiconductor switch arranged or connected in parallel with a Schottky diode. The high speed FET semiconductor switch may comprise a Si FET, GaN FET or any other type of FET which possesses higher speed switching capabilities and a lower voltage than that of the GaN-based HEMT FET. In one or more embodiments, the GaN-based HEMT FET and the higher speed switching device (i.e., the FET and Schottky diode) may be monolithically integrated on the same substrate for easier assembly and packaging.

DRAWINGS

The above-mentioned features and objects of the present disclosure will become more apparent with reference to the following description taken in conjunction with the accompanying drawings wherein like reference numerals denote like elements and in which.

DETAILED DESCRIPTION

The following detailed description is merely illustrative and is not intended to limit the invention or the application and uses of the invention. Furthermore, there is no intention to be bound by any expressed or implied theory presented in the preceding technical field, background, brief summary or the following detailed description.

The following description refers to components or features being "connected" or "coupled" together. As used herein, unless expressly stated otherwise, "connected" means that one component/feature is directly or indirectly connected to another component/feature, and not necessarily mechanically. Likewise, unless expressly stated otherwise, "coupled" means that one component/feature is directly or indirectly coupled to another component/feature, and not necessarily mechanically. Thus, although the figures may depict example arrangements of elements, additional intervening elements, devices, features, or components may be present in an actual embodiment (assuming that the functionality of the devices are not adversely affected).

Figure 2:
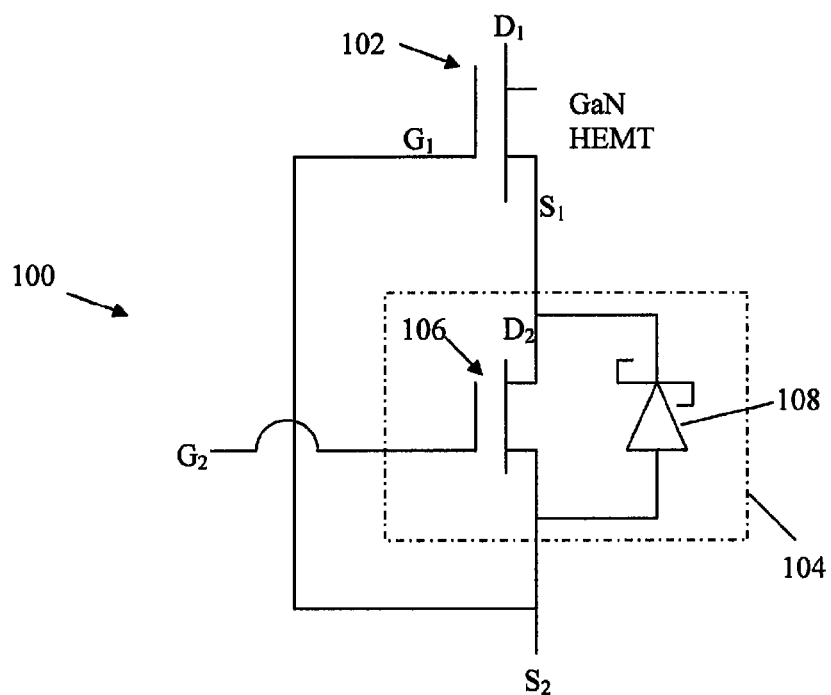
FIG. 2 is a circuit diagram illustrating a GaN-based device cascaded with an integrated FET/Schottky diode device in accordance with one or more embodiments of the present disclosure.

Referring to the circuit diagram of FIG. 2, in one or more embodiments, a power semiconductor device 100 is provided that includes a depletion mode (normally ON) main switching device 102 cascoded with a higher speed switching device 104, the result of which is an enhancement mode (normally OFF) FET device for switching power applications. In one or more embodiments, the main switching device 102 comprises a depletion mode GaN-based HEMT (High Electron Mobility Transistor) FET that does not include an intrinsic body diode, while it is understood that other types of depletion mode FETs that do not include an intrinsic body diode (e.g., a silicon carbide JFET or the like) may be utilized. To include a body diode, a separate semiconductor process has to be introduced to integrate a body diode or mechanically co-package a discrete diode. Switching device 102 may hereafter be referred to interchangeably as GaN FET 102 in the various embodiments described herein, while it is understood that any type of body diode-less depletion mode semiconductor switching device may be utilized for main switching device 102 or substituted therefore. The GaN FET 102 includes a drain $D_1$, source $S_1$ and a gate $G_1$ to control current flow between the drain $D_1$ and the source $S_1$.

In one or more embodiments, the higher speed switching device 104 comprises a switching structure 106, such as a high speed FET semiconductor switch, arranged or connected in parallel with a diode switching structure 108, such as a Schottky diode. In one or more embodiments, the Schottky diode 108 is a Si Schottky diode but may comprise other materials as well. In one or more embodiments, the switching structure 106 comprises a Si FET or any other type of enhancement mode FET which possesses higher speed switching capabilities than those of the main GaN FET 102. In some embodiments, the switching structure 106 may comprise a GaN FET. In one or more embodiments, the higher speed switching device 104 may comprise a circuit or device in which a FET 106 and a Schottky diode 108 are packaged together and in parallel to one another, sometimes referred to as a FETKY® by the present applicant. FETKY is a registered trademark of International Rectifier Corporation of El Segundo, Calif. In one or more embodiments, the FET 106 and Schottky diode 108 may comprise separate components that are connected and packaged together as the higher speed switching device 104. In other embodiments, the FET 106 and Schottky diode 108 may be monolithically integrated on the same substrate for easier assembly and packaging.

Figure 3:
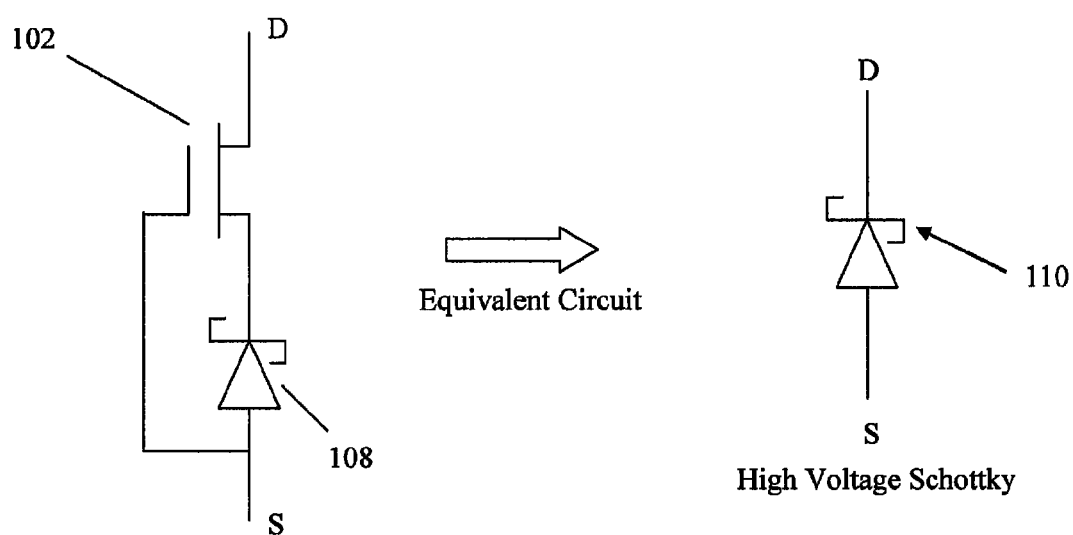
FIG. 3 is a circuit diagram of a GaN-based device cascoded with a Schottky diode and an equivalent circuit of the resulting high voltage Schottky device.

The Schottky diode 108 will carry current during conduction dead time of the FET 106, where the Schottky diode 108 has a low forward voltage drop and no reverse recovery loss for fast and efficient switching. During conduction dead time of the FET 106, current will flow through a high voltage Schottky diode device resulting from the cascoded arrangement of the GaN FET 102 with the Schottky diode 108, where the resulting high voltage Schottky device is illustrated in FIG. 3. The cascoded high voltage Schottky diode device of FIG. 3 can also be represented by a high voltage Schottky equivalent circuit representation, as further illustrated in FIG. 3. By having an integrated Schottky diode 108, the slow and inefficient internal body diode of the Si FET 106 can be bypassed, where the integrated Schottky diode 108 has a lower voltage drop and no reverse recovery problems, thereby providing higher efficiency.

Figure 4:
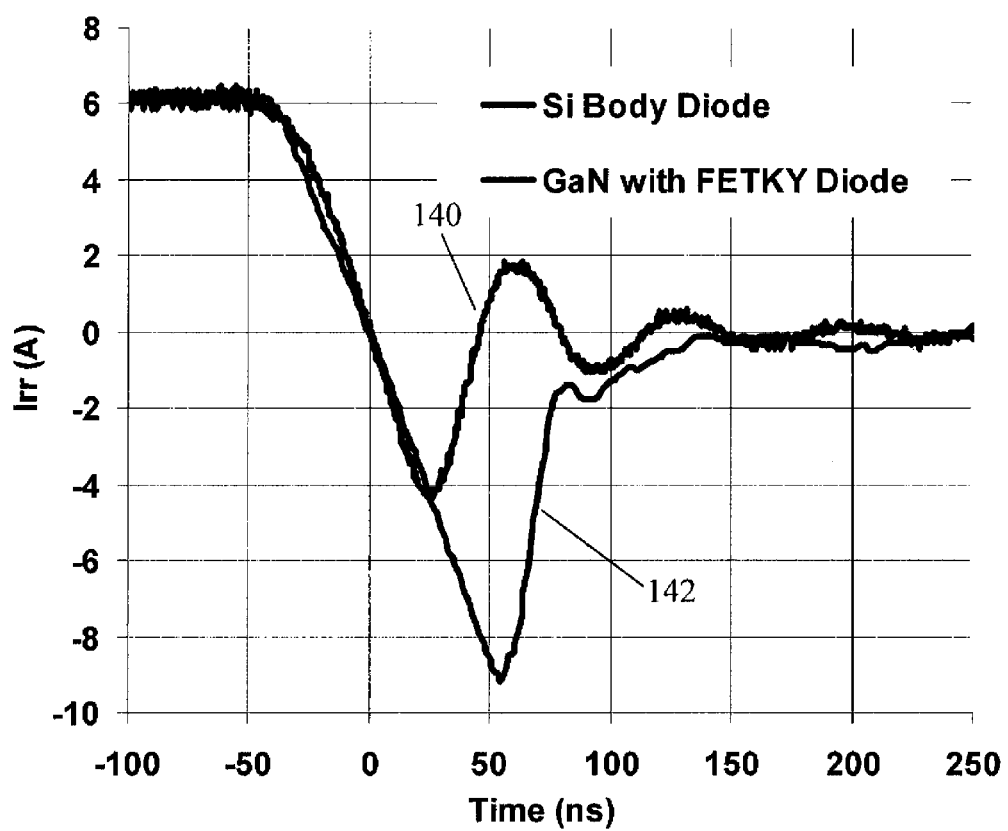
FIG. 4 is a graphical illustration of the reverse recovery current ($I_{rr}$) as a function of time through a device arranged similarly as the circuit diagram of FIG. 2 as compared to the reverse recovery current of a FET relying solely on a Si body diode.

Referring now to FIG. 4, a graphical illustration is provided of the reverse recovery current as a function of time through the device 100 as compared to the reverse recovery current of a Si body diode. Plot 140 illustrates the reverse recovery current ($I_{rr}$) in Amps (A) for the arrangement of FIG. 2 including a GaN FET 102 cascoded with the higher speed switching device 104 (i.e., the Si FET 106 and Schottky diode 108 arranged in parallel), while plot 142 illustrates the reverse recovery current ($I_{rr}$) of a Si FET including a Si body diode (e.g., such as Si FET 106 by itself). The significant reduction in the reverse recovery current and reverse recovery time of the cascoded device 100 as compared to that of a Si FET having a Si body diode can clearly be seen from FIG. 4.

Figure 1:
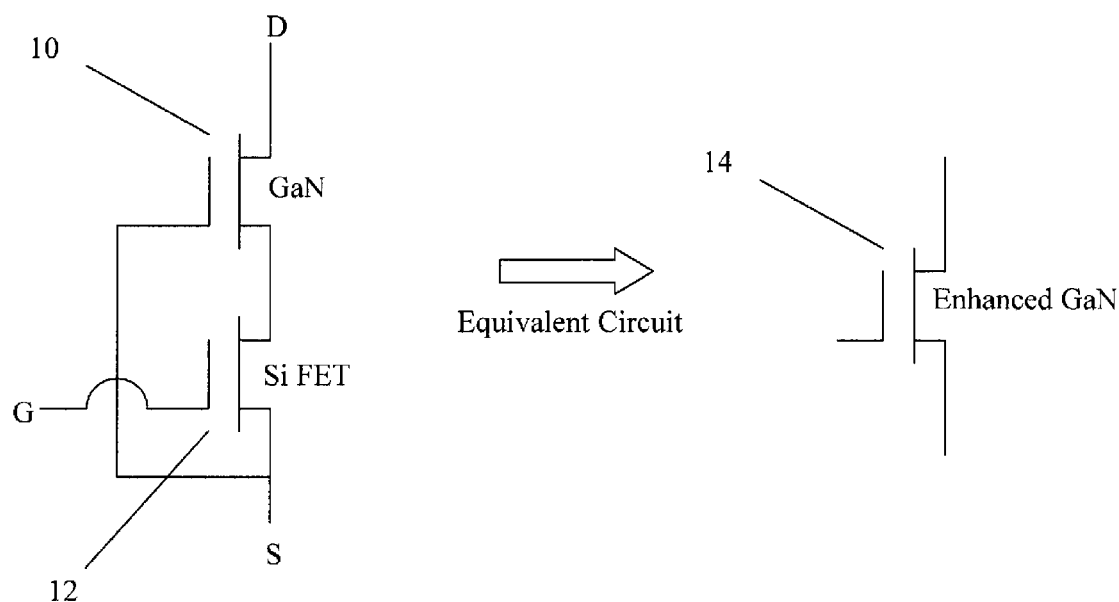
FIG. 1 is a circuit diagram illustrating a conventional depletion mode GaN device cascoded with a Si FET device and an equivalent circuit of the resulting enhanced mode GaN device.
Figure 5:
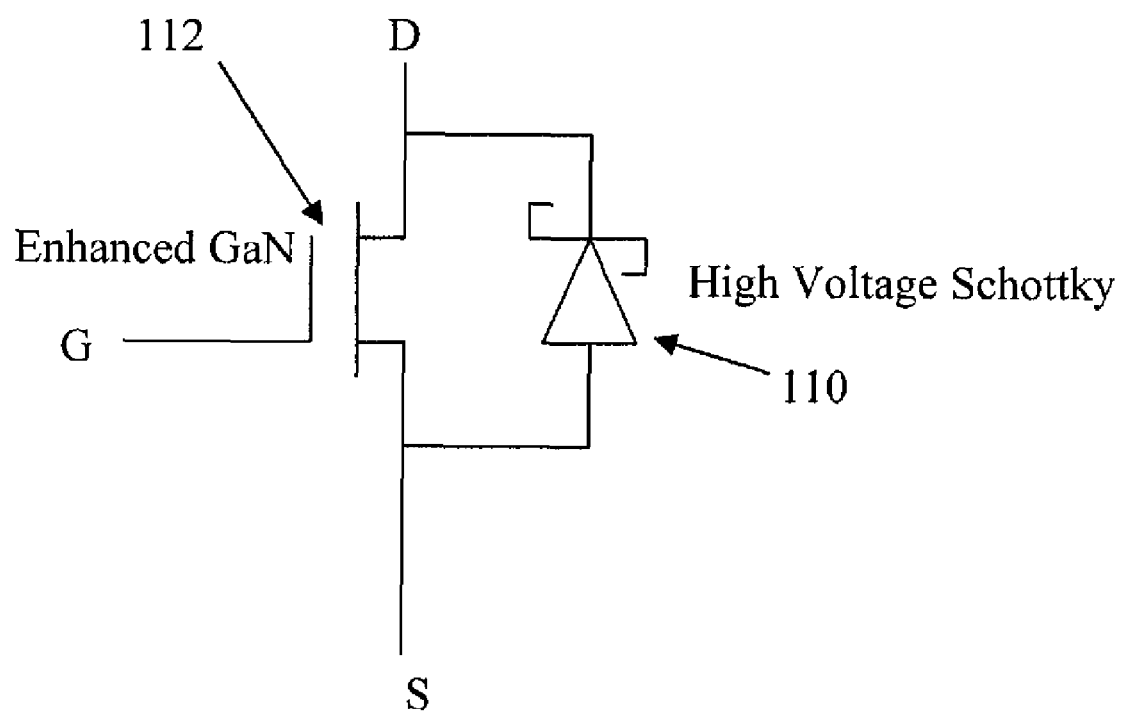
FIG. 5 is a circuit diagram illustrating the equivalent circuit of the enhanced mode cascoded GaN device of FIG. 2 in accordance with one or more embodiments of the present disclosure.

By cascoding the higher speed switching device 104 with the depletion mode GaN FET 102, the resulting equivalent device for the power semiconductor device 100 will operate in an enhanced mode (i.e., normally OFF) that allows for more efficient operation of the device 100. The circuit equivalent of FIG. 2 (by substituting the circuit equivalents of FIGS. 1 and 3) results in the equivalent enhanced mode GaN FET 112 arranged in parallel with the equivalent high voltage Schottky device 110, as illustrated in FIG. 5. In this manner, the GaN-based power semiconductor device 100 formed in accordance with one or more embodiments allows body diode-less depletion mode FET devices to be operated in an enhanced mode while further providing a Schottky diode to account for the missing body diode.

In or more embodiments, the GaN FET 102 comprises a higher voltage device than FET 106, where in operation the lower voltage FET 106 serves to amplify the voltage of the higher voltage GaN FET 102.

In one or more embodiments, the entire power semiconductor device 100 may be formed in a monolithic substrate, such that the GaN FET 102 is monolithically integrated with the higher speed switching device 104 in the same substrate. In order to allow for such monolithic integration, the FET 106 of the higher speed switching device 104 may also comprise an GaN FET. For example, the GaN FET 102 may comprise a higher voltage device than that of a lower voltage GaN FET 106, where, in operation, the lower voltage GaN FET 106 amplifies the voltage of the GaN FET 102. By monolithically integrating the GaN FET 102 with the higher speed switching device 104, all of the GaN devices can be formed on the same substrate, thereby making the power semiconductor device 100 easier to manufacture and package, such that the resulting packaging only requires three terminals for the source (S), drain (D) and gate (G) of the device 100 of FIG. 2.

The GaN-based power semiconductor device 100 can be used to perform switching operations in any number of devices and operations, including but not limited to AC-DC power conversion, DC-DC power conversion, motor drives, lighting, high density audio and automotive systems. In some embodiments, the components of the power semiconductor device 100 can be packaged in a single package thereby minimizing stray inductance and resistance that could otherwise occur due to printed circuit board (PCB) traces and packaging. The lower stray inductance reduces voltage spikes and increases reliability while the lower resistance results in higher efficiency. Such co-packaging simplifies layout, reduces packaging and assembly cost, increases power density and simplifies procurement logistics.

While the system and method have been described in terms of what are presently considered to be specific embodiments, the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

The invention claimed is:

1. An enhanced mode GaN field effect transistor (FET) device, comprising:
    a main GaN FET; and
    a switching device connected in a cascoded configuration with the main GaN FET, wherein the switching device includes a FET connected in parallel to a diode switching structure,
    wherein the main GaN FET cascoded with the switching device operates as an enhanced mode GaN FET device,
    wherein the GaN FET is monolithically integrated into the same substrate as the FET and diode switching structure of the switching device.

2. The enhanced mode GaN FET device of claim 1, wherein the switching device possesses higher speed switching capabilities than those of the main GaN FET.

3. The enhanced mode GaN FET device of claim 1, wherein the GaN FET is a higher voltage device than the switching device.

4. The enhanced mode GaN FET device of claim 1, wherein the diode switching structure comprises a Schottky diode.

5. The enhanced mode GaN FET device of claim 1, wherein the FET of the switching device comprises a Si FET.

6. An GaN field effect transistor (FET) device, comprising:
a high voltage GaN FET; and
a low voltage switching device connected in a cascoded configuration with the high voltage GaN FET, wherein the low voltage switching device includes a FET connected in parallel to a diode,
wherein the cascoded configuration of the high voltage GaN FET with the low voltage switching device operates as an enhanced mode GaN FET device,
wherein the high voltage GaN FET is monolithically integrated into the same substrate as the FET and diode of the low voltage switching device.

7. The GaN FET device of claim 6, wherein the low voltage switching device possesses higher speed switching capabilities than those of the high voltage GaN FET.

8. The GaN FET device of claim 6, wherein the FET of the low voltage switching device comprises a low voltage GaN FET.

9. The GaN FET device of claim 6, wherein the FET of the low voltage switching device comprises a Si FET.

10. An enhanced mode GaN field effect transistor (FET) device, comprising:
a main GaN FET; and
a switching device connected in a cascoded configuration with the main GaN FET, wherein the switching device includes a FET connected in parallel to a diode switching structure,
wherein the main GaN FET cascoded with the switching device operates as an enhanced mode GaN FET device,
wherein the switching device possesses higher speed switching capabilities than those of the main GaN FET.

11. The enhanced mode GaN FET device of claim 10, wherein the GaN FET is a higher voltage device than the switching device.

12. The enhanced mode GaN FET device of claim 10, wherein the diode switching structure comprises a Schottky diode.

13. The enhanced mode GaN FET device of claim 10, wherein the FET of the switching device comprises a Si FET.

14. The enhanced mode GaN FET device of claim 10, wherein the GaN FET is monolithically integrated into the same substrate as the FET and diode switching structure of the switching device.

15. An GaN field effect transistor (FET) device, comprising:
a high voltage GaN FET; and
a low voltage switching device connected in a cascoded configuration with the high voltage GaN FET, wherein the low voltage switching device includes a FET connected in parallel to a diode,
wherein the cascoded configuration of the high voltage GaN FET with the low voltage switching device operates as an enhanced mode GaN FET device,
wherein the low voltage switching device possesses higher speed switching capabilities than those of the high voltage GaN FET.

16. The GaN FET device of claim 15, wherein the FET of the low voltage switching device comprises a low voltage GaN FET.

17. The GaN FET device of claim 15, wherein the FET of the low voltage switching device comprises a Si FET.

18. The GaN FET device of claim 15, wherein the high voltage GaN FET is monolithically integrated into the same substrate as the FET and diode of the low voltage switching device.

19. The GaN FET device of claim 15, wherein the diode is a Schottky diode.

20. The GaN FET device of claim 6, wherein the diode is a Schottky diode.

* * * * *